United States Patent
Jaussi et al.

(10) Patent No.: US 6,563,374 B1
(45) Date of Patent: May 13, 2003

(54) POSITIVE AND NEGATIVE CURRENT FEEDBACK TO VARY OFFSET IN VARIABLE-OFFSET AMPLIFIER CIRCUITS

(75) Inventors: James E. Jaussi, Hillsboro, OR (US); Bryan K. Casper, Hillsboro, OR (US)

(73) Assignee: Intel Corporation, Santa Clara, CA (US)

(*) Notice: Subject to any disclaimer, the term of this patent is extended or adjusted under 35 U.S.C. 154(b) by 0 days.

(21) Appl. No.: 10/099,547

(22) Filed: Mar. 15, 2002

(51) Int. Cl.[7] .................................................. H03F 3/45
(52) U.S. Cl. ........................ 327/562; 327/563; 327/362; 330/253; 330/256
(58) Field of Search ................................. 327/560, 562, 327/563, 362, 407, 408; 330/259, 253, 256, 261, 258

(56) References Cited

U.S. PATENT DOCUMENTS

| | | | |
|---|---|---|---|
| 4,754,169 A | 6/1988 | Morris | 327/307 |
| 4,987,327 A | 1/1991 | Fernandez et al. | 327/543 |
| 5,043,599 A | 8/1991 | Zitta | 327/65 |
| 5,079,515 A * | 1/1992 | Tanimoto | 330/256 |
| 5,512,848 A | 4/1996 | Yaklin | 327/65 |
| 5,517,134 A | 5/1996 | Yaklin | 327/65 |
| 5,563,598 A | 10/1996 | Hickling | 341/155 |
| 6,348,882 B1 | 2/2002 | Ciccone et al. | 341/36 |
| 6,388,521 B1 | 5/2002 | Henry | 327/258 |
| 6,420,932 B1 * | 7/2002 | Casper | 330/258 |

OTHER PUBLICATIONS

Baker, *CMOS Circuit Design, Layout, and Simulation,* "Chapter 26: Nonlinear Analog Circuits," IEEE Press, 1998, pp. 685–699.

Ellersick et al. "GAD: A 12–GS/s CMOS 4–bit A/D Converter for an Equalized Multi–Level Link," *1999 Symposium on VLSI Circuits Digest of Technical Papers,* pp. 49–52.

Farjad–Rad et al., "A 0.3–$\mu$m CMOS 8–Gb/s 4–PAM Serial Link Transceiver," *IEEE J. Solid State Circuits,* 2000, 35(5):757–764.

Yang et al., "A Scalable 32Gb/s Parallel Data Transceiver with On–chip Timing Calibration Circuits," *2000 IEEE International Solid–State Circuit Conference,* Digest of Technical Papers, pp. 258–259.

\* cited by examiner

*Primary Examiner*—Dinh T. Le
(74) *Attorney, Agent, or Firm*—Fish & Richardson, P.C., P.A.

(57) ABSTRACT

A variable offset amplifier circuit includes two differential transistor pairs and a variable current generator coupled to each differential pair to control tail current. Each differential transistor pair has a first transistor and a second transistor. The first transistors are for coupling to first and second loads. A current mirror and shunt is coupled to shunt a portion of current flowing through one of the first transistors from flowing through a correspondingly coupled load. The shunt current is mirrored from one of the second transistors to provide either positive current feedback or negative current feedback. The amplifier circuit has applications in a comparator circuit that also has a regenerative latch circuit, and as a sense amplifier in a receiver of a communications system.

32 Claims, 7 Drawing Sheets

POSITIVE AND NEGATIVE CURRENT FEEDBACK TO VARY OFFSET IN VARIABLE-OFFSET AMPLIFIER CIRCUITS

TECHNICAL FIELD

The invention is related to amplifier circuits having variable offset capability, and applications of such circuits.

BACKGROUND

Amplifier circuits are used to amplify an input electrical signal to provide current or voltage gains or reductions. They may be used to amplify a single ended or a differential signal. In addition, when used in conjunction with an output regenerative latch stage, they can provide a digital output signal (having one of two stable states) that is an indication of a comparison between two single ended input signals or a determination of the magnitude of a differential signal. A basic component of many amplifier circuits is the differential transistor pair used as the input stage of the amplifier.

Most practical implementations of amplifier circuits suffer from manufacturing process-induced variations in the structure of the circuit devices, which cause an offset in the amplifier's operation. The offset may be explained by, for instance, considering an amplifier that is designed to amplify a differential input signal. In some applications, the output of the amplifier would ideally be zero volts if the input differential signal was zero volts. However, in practice, a zero voltage differential signal often yields a small but nevertheless non-negligible output offset voltage. Output offset may be corrected using a wide range of techniques known as offset cancellation techniques. In one such technique, the value of the input differential signal that actually yields a zero output voltage is measured and stored, and then is subsequently subtracted from each new input signal to thus cancel the offset of the amplifier. In other applications of amplifier circuits, such as a pre-amplifier circuit in a comparator circuit, the amplifier circuit is designed to have a specified offset so that a comparison is indicated only when the offset is overcome.

The trend in circuit design is toward smaller and smaller device sizes, which serves not only to minimize space consumption, but also to minimize the capacitance and hence maximize the speed of circuits that incorporate the devices. However, with smaller device sizes, process-induced variations become more of an issue because the probability for process-induced variation in the structure of a device becomes greater as device size becomes smaller.

DESCRIPTION OF DRAWINGS

Like reference symbols in the various drawings indicate like elements.

DETAILED DESCRIPTION

The invention provides an amplifier circuit that introduces a variable offset, which may correct offset in amplifier operation caused by process-induced variations in the structure of circuit devices or induce a specified offset where that is needed for the application. The invention provides variability in the offset through various positive or negative current feedback combinations. For example, in some embodiments, the positive or negative current feedback is used to alter the range or the resolution of settable offset voltages that a given amplifier circuit is able to achieve. The invention further provides circuit applications for the variable offset amplifier circuit, including for example, a variable offset comparator circuit and a communications system in which the variable offset comparator circuit is used.

Figure 1:
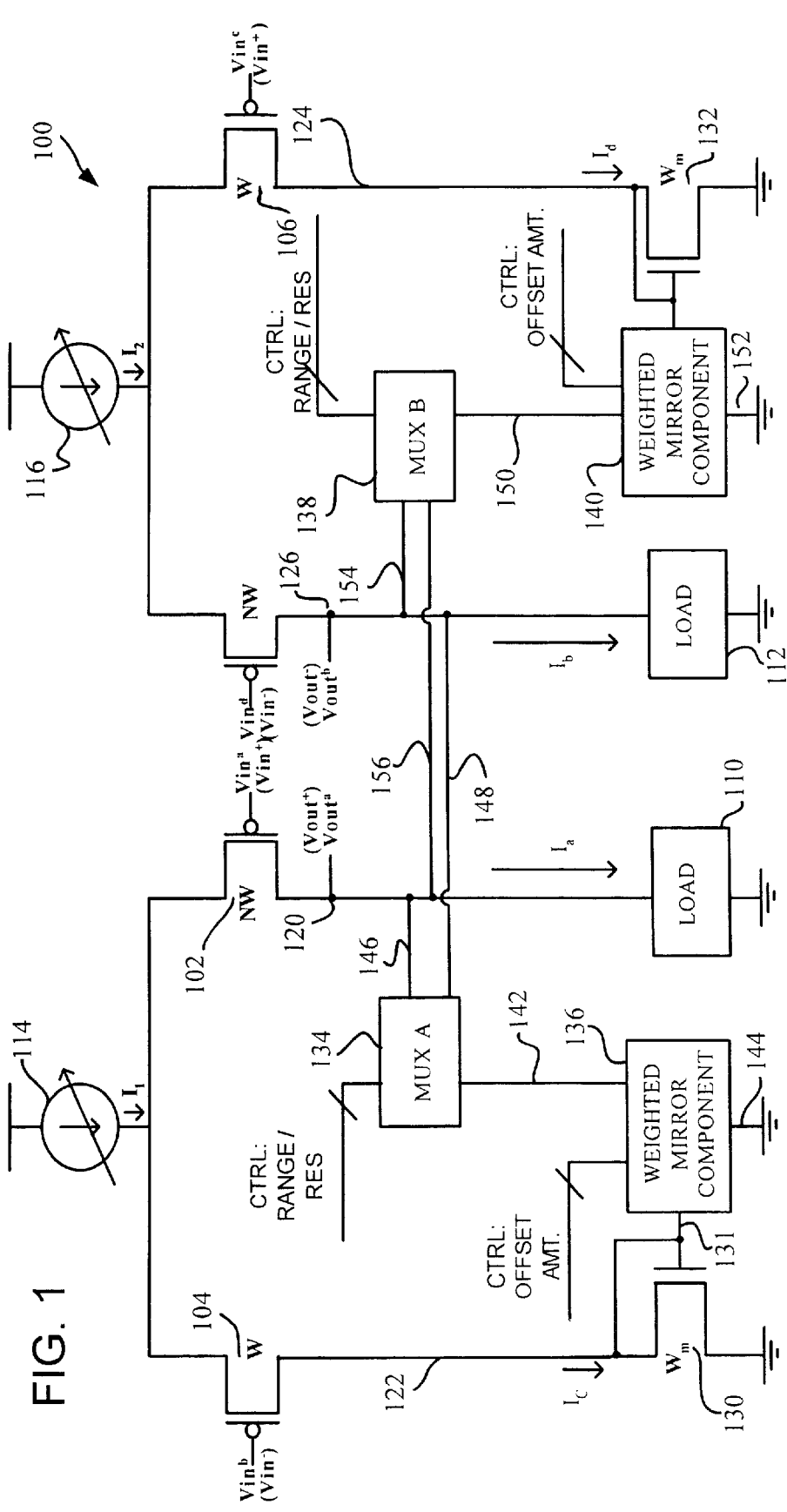
FIG. 1 is a schematic diagram of an embodiment of an amplifier circuit in accordance with the invention.

An embodiment of a variable offset amplifier circuit in accordance with the invention, shown in FIG. 1, includes a first differential transistor pair 102, 104, and a second differential transistor pair 106, 108. In this embodiment, the transistors of the differential pairs are implemented in p-channel metal oxide semiconductor field effect transistors (MOSFETs). Each differential transistor pair in this embodiment is intentionally unbalanced. The unbalanced characteristic, in this embodiment, is obtained by transistor 102 being sized differently from the transistor 104 by a factor of N in the width of the transistor channel. In this embodiment, N may be greater or less than one. For example, N may equal 0.1, 0.4, 0.8, 3, 8, etc. Also, transistor 108 has a different channel width than that of transistor 106, by, in this embodiment, the same factor N. The length of the transistor channels may be the same across all transistors in the amplifier circuit 100. The unbalanced characteristic may also be achieved using different lengths and similar widths for the transistors as is known in the art, or by using a combination of length and width variations.

Figure 4:
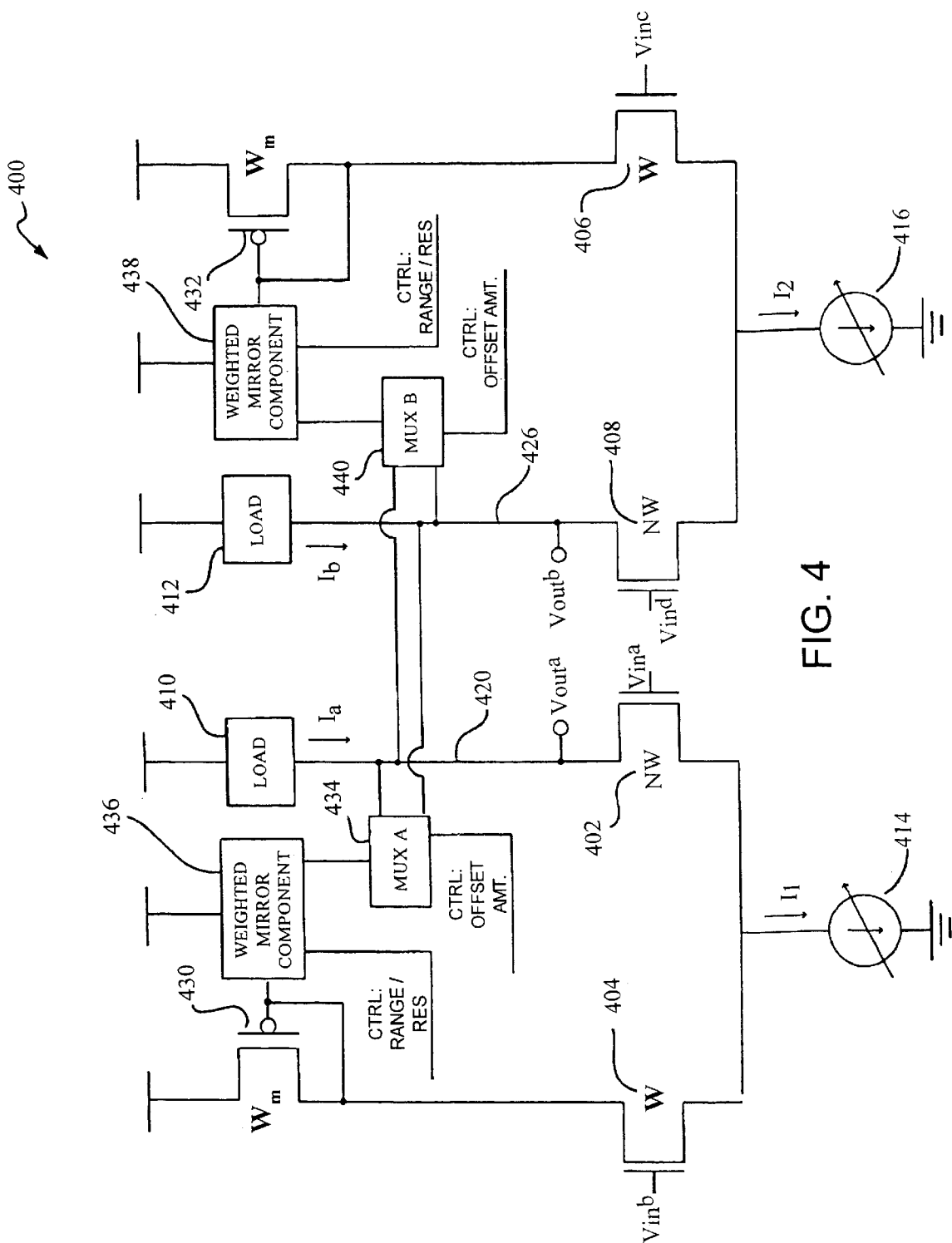
FIG. 4 is a schematic diagram of another embodiment of an amplifier circuit in accordance with the invention.

The respective tail currents ($I_1$ and $I_2$) of the differential pairs are controlled by current generators 114 and 116 as shown. In this embodiment, the current generators 114 and 116 are variable current generators that pass the tail currents of the respective differential pairs. Other types of current generators may alternatively be used, for example, current sinks, as shown in FIG. 4.

Returning to FIG. 1, the larger transistor 102 of the first transistor pair has its drain terminal (output node 120) coupled to a corresponding first load 110 and in turn to a voltage return (i.e., ground), while the larger transistor 108 of the second transistor pair has its drain terminal (output node 126) coupled to a corresponding second load 112 and in turn to ground. Output nodes 120 and 126, in this embodiment, serve as the output terminals $V_{out}^a$ and $V_{out}^b$ of the amplifier circuit 100. The load devices 110 and 112 may include passive and/or active circuits, depending on the application of the amplifier circuit 100. The load devices may alternatively represent a separate output amplification stage that provides an output signal at further output nodes of the stage.

The smaller transistor 104 of the first transistor pair may have its drain terminal (output node 122) coupled to the gate and drain terminals of diode-connected n-channel MOSFET transistor 130, and in turn, the source terminals of MOSFET transistor 130 may be coupled to ground. Similarly, the smaller transistor 106 of the second transistor may have its drain terminal (output node 124) coupled to the gate and drain terminals of diode-connected n-channel MOSFET transistor 132, and in turn, the source terminals of MOSFET transistor 132 may be coupled to ground. As such, in this embodiment drain currents through transistors 104 and 130 equal one another, as do drain currents through transistors 106 and 132.

The amplifier circuit 100 provides output voltages $V_{out}^a$ and $V_{out}^b$ in response to the input voltages $V_{in}^a$, $V_{in}^b$, $V_{in}^c$, and $V_{in}^d$. In an embodiment of the amplifier circuit, a difference output voltage $V_{out}^a - V_{out}^b$ is generated in response to the difference input voltages $V_{in}^a - V_{in}^b$ and $V_{in}^c - V_{in}^d$. Also, one difference input voltage, $V_{in}^+$, may serve as both $V_{in}^a$ and $V_{in}^c$, while another difference input voltage, $V_{in}^-$, may serve as both $V_{in}^b$ and $V_{in}^d$, as is indicated by the variables in parentheses in FIG. 1. The gain of the amplifier circuit 100 may be determined by a variety of factors, including the impedance $R_{load}$ of the load devices 110 and 112, and the transconductance $g_m$ of each transistor in the first and second differential pairs.

Although the amplifier circuit 100 of FIG. 1 further includes, in this embodiment, two multiplexer circuits 134 and 138 and two weighted current mirror components 136 and 140, the operation of the amplifier circuit 100 will first be described ignoring the effects of multiplexer circuits 134 and 138 and mirror components 136 and 140. Such an amplifier circuit is also described in commonly assigned U.S. patent application to James E. Jaussi, entitled "Variable Offset Amplifier Circuits and Their Applications," and filed on even date.

Consider the situation where the input voltages are equal $V_{in}^a = V_{in}^b = V_{in}^c = V_{in}^d$. Also assume that the tail currents $I_1$, and $I_2$ are equal and the load impedances are equal. In such a configuration, the amplifier circuit 100 provides a nominal offset that will appear at the output as:

$$V_{out}^a - V_{out}^b = V_{nominal} = \{[N/(N+1)]I_1\}R_{load} - \{[N/(N+1)]I_2\}R_{load} = 0. \quad (1)$$

Next, keeping the input voltages the same, if $I_1$, is increased and $I_2$ is decreased both by the same amount, namely $I_1 + \Delta I$ and $I_2 - \Delta I$, then $V_{out}^a$ changes to the following:

$$V_{out}^a = \{[N/(N+1)][I_1 + \Delta I]\}R_{load} \quad (2)$$

Similarly, the new value of $V_{out}^b$ is given by:

$$V_{out}^b = \{[N/(N+1)][I_2 - \Delta I]\}R_{load} \quad (3)$$

Finally, assuming as mentioned above that $I_1$ is equal to $I_2$, the difference voltage $V_{out}^a - V_{out}^b$ is given by:

$$V_{out}^a - V_{out}^b = [2N/(N+1)]\Delta I \, R_{load} \quad (4)$$

Thus, increasing $I_1$ and decreasing $I_2$ resulted in a decrease in the difference output voltage as given in the expression above. This decrease is the offset forced by the change in tail currents. Now, if the tail currents are changed in the reverse direction, that is if $I_1$ is decreased and $I_2$ is increased by the same amount, then following an analysis similar to that above gives the following expression:

$$V_{out}^a - V_{out}^b = -[2N/(N+1)]\Delta I \, R_{load} \quad (5)$$

which is an offset in the output voltage that is opposite in polarity to that given by equation (4). Thus, this example illustrates how opposite polarity offsets may be obtained in proportion to a differential change in the tail currents.

The above equations show that with the amplifier circuit 100 of FIG. 1 without the multiplexer circuits 134 and 138 and mirror components 136 and 140, a variable offset in the output voltage may be achieved by varying current sources 114 and/or 116. The magnitude of the voltage offset is determined also by the transistor unbalance measure N and the load resistance $R_{load}$.

Returning now to a description of the amplifier circuit 100 shown in FIG. 1, weighted mirror component 136 and diode-connected transistor 130 form a current mirror that mirrors the current $I_c$ through transistor 130 to the current through the weighted mirror component 136, namely, from line 142 to line 144. Control input "CTRL: OFFSET AMT" to mirror component 136 may be included to control the weighting of the current mirror, as will be further explained later with FIG. 2. Multiplexer circuit 134, under the control of control input "CTRL: RANGE/RES", connects line 142 either to node 120 via line 146, or to node 126 via line 148, as will be further explained later with FIG. 3. Depending upon whether the mirror component 136 is connected to either node 120 or node 126, either a portion of the current through transistor 102, or a portion of the current through transistor 108, will be shunted to ground through the weighted mirror component 136. As such, less current will flow through the respectively coupled load 110 or 112.

Weighted mirror component 140 and diode-connected transistor 132 similarly form a current mirror that mirrors the current (Id) through transistor 132 to the current through the weighted mirror component 140, from line 150 to line 152. Control input "CTRL: OFFSET AMT" to mirror component 140 also may be included to control the weighting of the current mirror. Multiplexer circuit 138, under the:control of control input "CTRL: RANGE/RES", connects line 150 either to node 126 via line 154, or to node 120 via line 156. Depending upon whether the mirror component 140 is connected to either node 120 or node 126, either a portion of the current through transistor 102, or a portion of the current through transistor 108, will be shunted to ground through the weighted mirror component 140. As such, less current will flow through the respectively coupled load 110 or 112.

Figure 2:
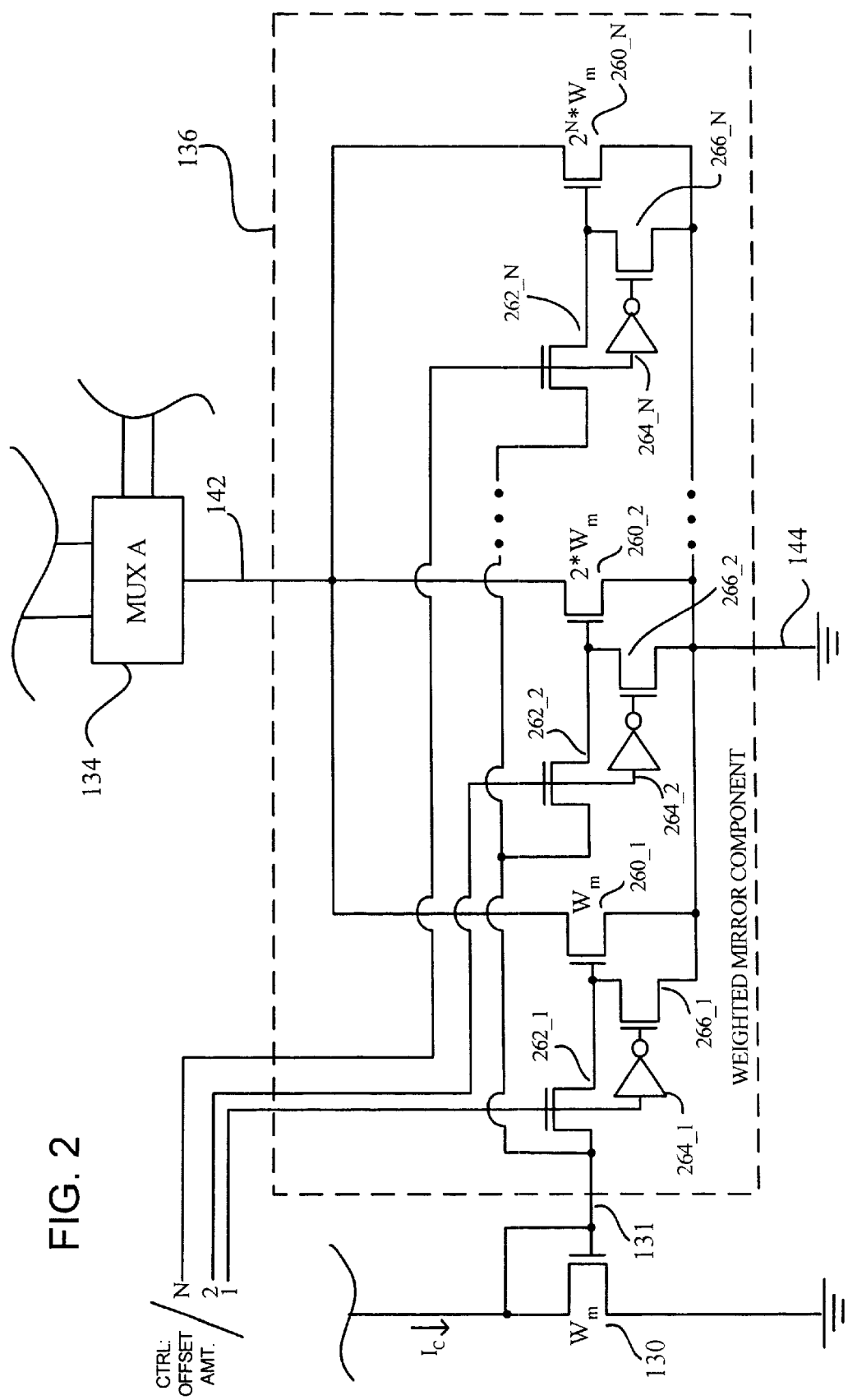
FIG. 2 is a schematic diagram showing more detail of an if embodiment of a weighted mirror component in the amplifier circuit of FIG. 1.

In FIG. 2, an embodiment of a weighted mirror component 136 includes a number of transistors 260_1, 260_2, . . . 260_N that may pass current mirrored from transistor 130. Weighted mirror component 138 (see FIG. 1) may be of similar design, and so need not be described herein. Returning to FIG. 2, the mirror component 136 receives the multi-bit control input "CTRL: OFFSET AMT." to vary the amount of mirrored current that flows from line 142 to line 144. Lines 1, 2, . . . N of the control signal are connected to pass gates 262_1, 262_2, . . . 262_N. As such, if line 1 is high, for example, the voltage at the gate and drain terminals of transistor 130 is permitted to pass through pass gate 262_1 and is received at the gate of transistor 260_1. In similar fashion, if line 2 is high, the gate voltage of transistor 130 similarly passes through pass gate 262_2 and is received at the gate of transistor 260_2; and if line N is high, the gate voltage of transistor 130 similarly passes through pass gate 262_N and is received at the gate of transistor 260_N. Transistors 266_1, 266_2 . . . 266_N, and inverters 264_1, 264_2 . . . 264_N may be included to ensure that when the respective control signals are low, the gate terminals of transistors 260_1, 260_2 . . . 260_N are held low and thus no current from lines 142 to 144 is able to pass through these transistors.

Transistors 260_1, 260_2, ... 260_N may be sized differently from one another as shown in the embodiment shown in FIG. 2. For example, transistor 260_1 may have a width sized equal to the width $W_m$ of transistor 130, and, so transistor 260_1, when enabled, will pass current from line 142 to 144 that is equal to current $I_c$ through transistor 130. Transistor 260_2 may have a width twice that of transistor 130, and so transistor 260_2, when enabled, will pass current from line 142 to 144 that is two times the current $I_c$ through transistor 130. Similarly, transistor 260_N may have a width of $2^N$ times the width of transistor 130, and thus passes current that is $2^N$ times the current $I_c$ through transistor 130. As such, the current from lines 142 to 144 may be set by control input "CTRL: OFFSET AMT." to be any multiple of $I_c$. For example, if only line 1 is high, the current from line 142 to 144 will equal $I_c$; if only line 2 is high, the current from line 142 to 144 will equal $2I_c$, and so on. In other embodiments, transistors 260_1, 260_2, ... 260_N may be sized relative to transistor 130 such that the controllable shunted current from line 142 to 144 may equal various fractions of current $I_c$, or to fractions and multiples of $I_c$.

Figure 3:
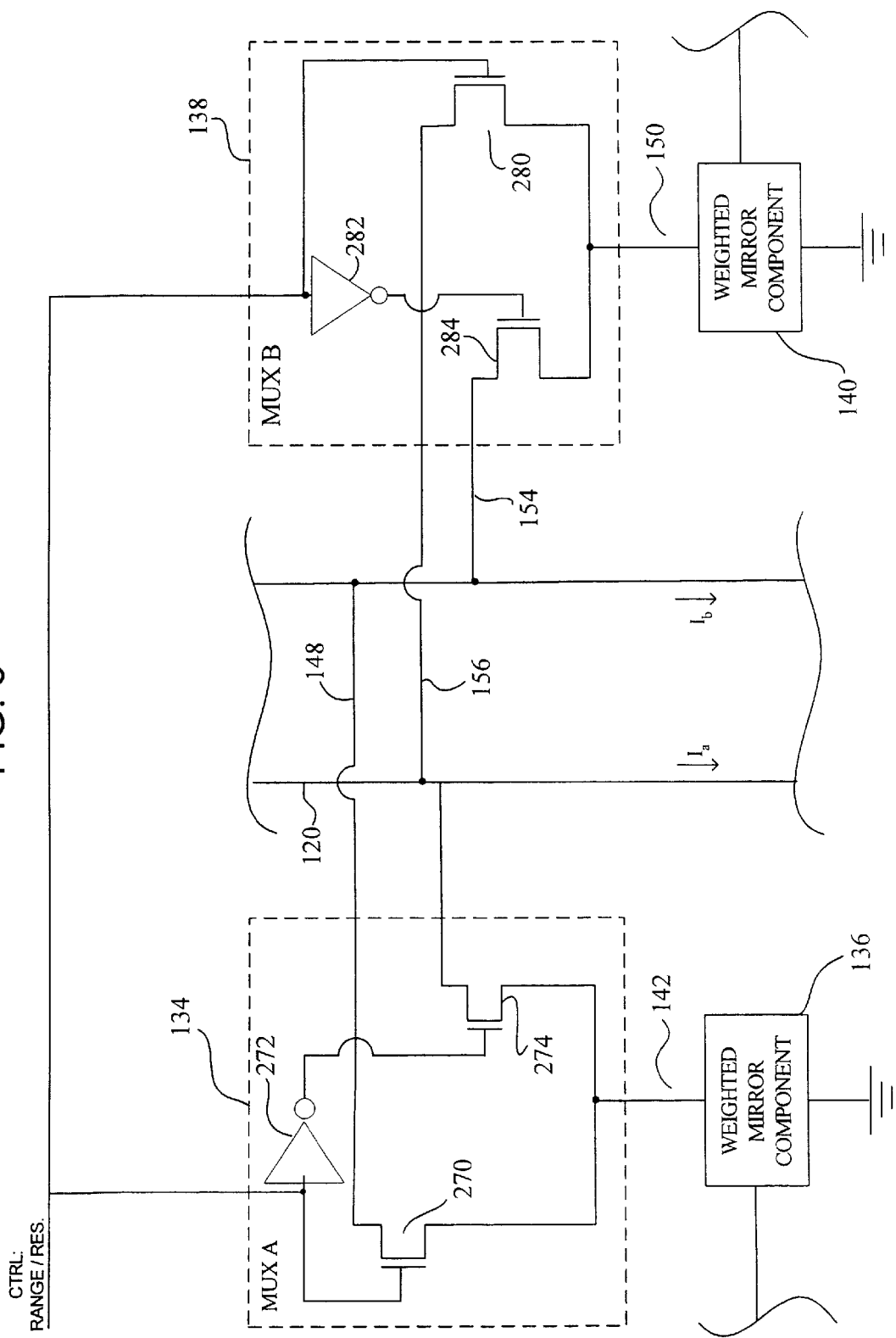
FIG. 3 is a schematic diagram showing more detail of an embodiment of multiplexer circuits in the amplifier circuit of FIG. 1.

In FIG. 3, an embodiment of multiplexer circuits 134 and 138 receive the same control input "CTRL: RANGE/RES." A high control input corresponds to greater range in offset settings (by positive feedback), whereas a low control input corresponds to greater resolution in offset settings (by negative feedback). The control signal is received at the gate terminals of transistor 270 of multiplexer circuit 134 and transistor 280 of multiplexer circuit 138. The control signal is also received at inverters 272 and 282, and in turn the inverted control signal is received at the gate terminals of transistor 274 of multiplexer circuit 134 and transistor 284 of multiplexer circuit 138. If the control input is high, transistor 270 is active and so line 142 from mirror component 136 is connected to node 126. A high control input also makes transistor 280 active, and so line 150 is connected to node 120. On the other hand, if the control input is low, then transistors 274 and 284 are active, and so line 142 is connected to node 120 and line 150 to node 126.

Consider now the operation of the FIG. 1 amplifier circuit 100 with the multiplexers 134 and 138 and the mirror components 136 and 140. Consider again the situation where the input voltages are equal $V_{in}^a = V_{in}^b = V_{in}^c = V_{in}^d$. Also assume that the tail currents $I_1$ and $I_2$ are equal and the load impedances are equal. Also in this example, the weighting of the mirrored current (that is, the setting of "CTRL: OFFSET AMT") is set to be the same for both mirror components 136 and 140, and is a multiple $N_m$ of currents $I_c$ and $I_d$ through the smaller transistors 130 and 132. Finally, the multiplexer circuits 134 and 138 in this example are set to give positive feedback ("CTRL: RANGE/RES"= high), so that line 142 is connected to node 126 and line 150 is connected to node 120. In such a configuration, the amplifier circuit 100 provides a nominal offset that will appear at the output as:

$$V_{out}^a - V_{out}^b = V_{nominal} - I_a * R_{load} - I_b * R_{load}$$

where, $$I_a = [N/(N+1)]I_1 - N_m I_{d=}[N/(N+1)]I_1 - N_m[1/(N+1)]I_2$$

$$I_b = [N/(N+1)]I_2 - N_m I_c = [N/(N+1)]I_2 - N_m[1/(N+1)]I_1$$

Next, keeping the input voltages the same, if $I_1$ is increased and $I_2$ is decreased both by the same amount, namely $I_1 + \Delta I$ and $I_2 - \Delta I$, then $V_{out}^a$ changes to the following:

$$V_{out}^a = \{[N/(N+1)][I_1+\Delta I] - N_m[1/(N+1)][I_2-\Delta I]\}R_{load} = \{I+[(N+N_m)/(N+1)]\Delta I\}R_{load} \qquad (2)$$

Similarly, the new value of $V_{out}^b$ is given by:

$$V_{out}^b = \{[N/(N+1)][I_2\Delta I] - N_m[1/(N+1)][I_1+\Delta I]\}R_{load} = \{I-[(N+N_m)/(N+1)]\Delta\}I R_{load} \qquad (3)$$

Finally, assuming as mentioned above that $I_1$ is equal to $I_2$, the difference voltage $V_{out}^b - V_{out}^a$ is given by:

$$V_{out}^a - V_{out}^b = 2[(N+N_m)/(N+1)]\Delta I\, R_{load} \qquad (4)$$

Thus, it is seen that with the addition of $N_m$ in the above equation, the positive feedback offered by the mirroring and shunting of current from the loads provides for a wider range of offset settings, with all other things being equal. As $I_1$ is increased and $I_2$ is decreased, relatively more current will be shunted from $I_b$ than will be shunted from $I_a$, thus providing a form of positive feedback to the offset adjustment made to current generators 114 and 116. Conversely, consider where the multiplexer circuits 134 and 138 are set for negative feedback ("CTRL: RANGE/RES"=low), where line 142 is connected to node 120 and line 150 is connected to node 126. By similar equations to those above, it can be seen that the difference voltage $V_{out}^a - V_{out}^b$ is given by:

$$V_{out}^a - V_{out}^b = 2[(N-N_m)/(N+1)]\Delta I\, R_{load} \qquad (5)$$

Thus, it is seen that the negative feedback reduces the range of offset settings; however, the resolution of offset settings will be increased. In other words, as $I_1$ is increased and $I_2$ is decreased, relatively more current will be shunted from $I_a$ than will be shunted from $I_b$, thus providing a form of negative feedback to the offset adjustment made to current generators 114 and 116.

Therefore, the amplifier circuit 100 has the capability of being set up to have different offset ranges and resolutions, without having to alter the fabrication of the differential pairs or the current sources. As such, the same circuit die may be used for different amplifier applications, for example, where in some applications a wide range of offsets is needed, whereas in other applications fine resolution in the offset is needed. Then, for example, the voltage offset may be set by setting the current levels of current sources 114 and 116 during testing of the circuit 100.

Referring now to FIG. 4, another embodiment of an amplifier circuit 400 in accordance with the invention uses n-channel MOSFETs 402, 404 for the first differential pair and n-channel MOSFETs 406, 408 for the second differential pair. The variable current generators in this embodiment are current sinks 414 and 416 which control the tail currents of the differential transistor pairs, respectively. The output node 420 is coupled to a load 410 which in turn is coupled to a power supply node, whereas output node 426 is coupled to a load 412 which is also coupled to the power supply node. Thus, in contrast to the embodiment of FIG. 1, the amplifier circuit 400 in FIG. 4 has its load devices 410, 412 referenced to a power supply node rather than to a power return (that is, ground) node.

Transistors 404 and 406 have their respective output nodes (that is, drain terminals) coupled to the gate and drain of diode-connected p-channel MOSFETs 430 and 432, respectively. In turn, the source terminals of MOSFETs 430 and 432 are coupled to the power supply node. Also, mirror components 436 and 440 are each coupled to the power supply node and respectively to transistor 430 and 432 to form current mirrors. Through the respective multiplexer circuits 434 and 438, mirror components 436 and 440 are coupled to either node 420 or 426. As such, current from the power supply node flowing through transistors 402 and 408 is shunted from loads 410 and 412. Despite these differences, the same ability to adjust the offset in the manner discussed previously is present.

Figure 5:
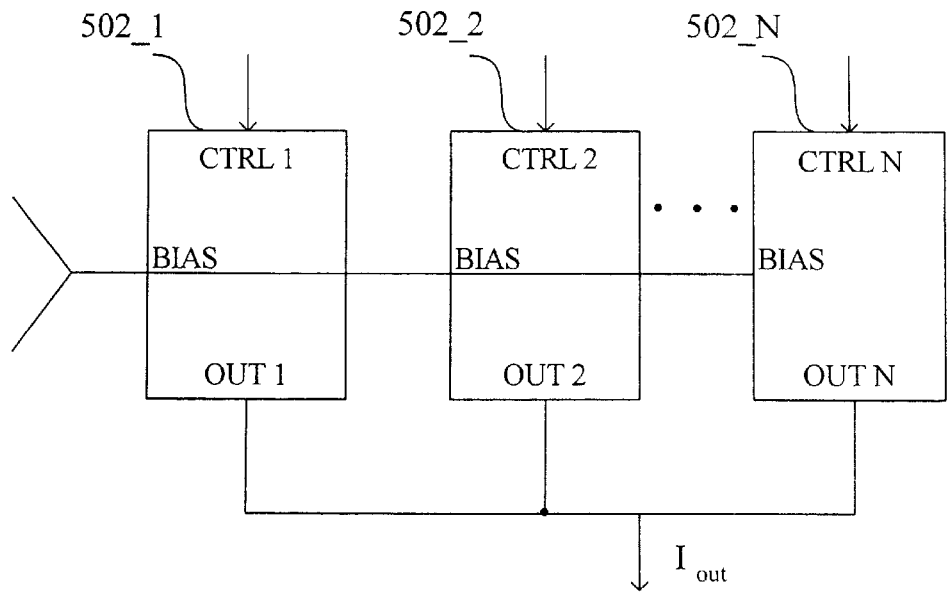
FIG. 5 is a schematic diagram of an embodiment of a current source that may be used with the circuit of FIG. 1.

Referring to FIG. 5, this figure depicts a circuit schematic of an embodiment of a digitally controllable current source that can be used in place of the variable current generator 114 or 116 of FIG. 1. This current source has a number of digitally variable current cells 502_1, 502_2 ... 502_N that are coupled in parallel to provide their individual currents which are summed to yield $I_{out}$. This output current $I_{out}$ may be the tail current of a differential transistor pair. Each individual cell current may be adjusted by varying a bias level in each cell, for example, using a binary weighted current set by a current mirror (not shown). The individual cell current may be turned on or off in response to a signal at a control input CTRL as shown. This control signal may be digital in nature, that is have one of two stable states corresponding to two levels of current at each individual cell's output. The total current may thus be adjusted by setting a digital value at the control inputs of the individual cells 502.

It should be noted that the output currents provided by the individual cells 502 may be unbalanced. For instance, some of the cells may provide larger currents (for course granularity control of the output current) while others may provide smaller currents (for fine granularity control of the output current $I_{out}$). Use of such digitally controllable current sources allows the offset of the amplifier circuit in FIG. 1 to be trimmed digitally, by selecting the desired offset according to a multi-bit digital value.

Figure 6:
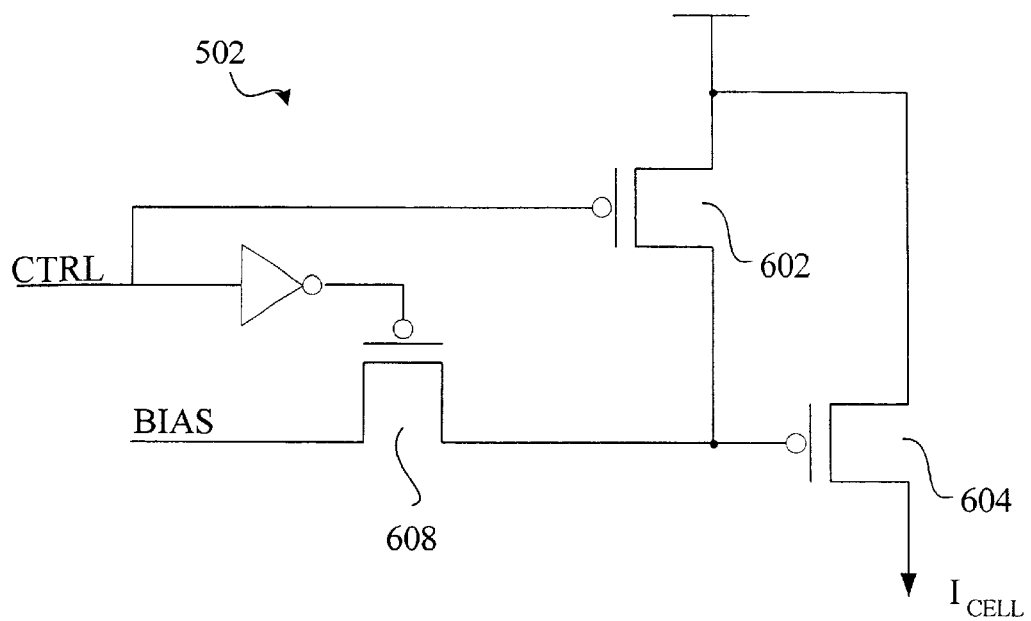
FIG. 6 is a schematic diagram of an embodiment of current source cell that may be used with the current source of FIG. 5.

FIG. 6 shows a circuit schematic of an embodiment of a digitally controllable current source cell 502. When the input signal at CTRL is at a relatively high voltage, such that the p-channel transistor 604 is biased according to an input bias signal at BIAS via p-channel transistor 608. In the other state, i.e., when the input signal at CTRL drops to a relatively low voltage such that p-channel transistor 602 has its channel inverted, the gate of the p-channel transistor 604 is pulled to a relatively high voltage that is sufficient to, in this embodiment, place the transistor 604 in cutoff. Thus, two different levels of cell current $I_{cell}$, e.g., "on" and "off," are obtained in response to the input control signal at CTRL. As mentioned in the previous paragraph, the various cells may be designed to provide different levels of "on" currents so that some may be used for fine granularity control of the total current $I_{out}$ (see FIG. 5) while others may be used for relatively course granularity control of this output current. Referring back to FIG. 6, the varying levels of "on" currents may be achieved by sizing the transistor 604 as known to those of ordinary skill in the art.

Figure 7:
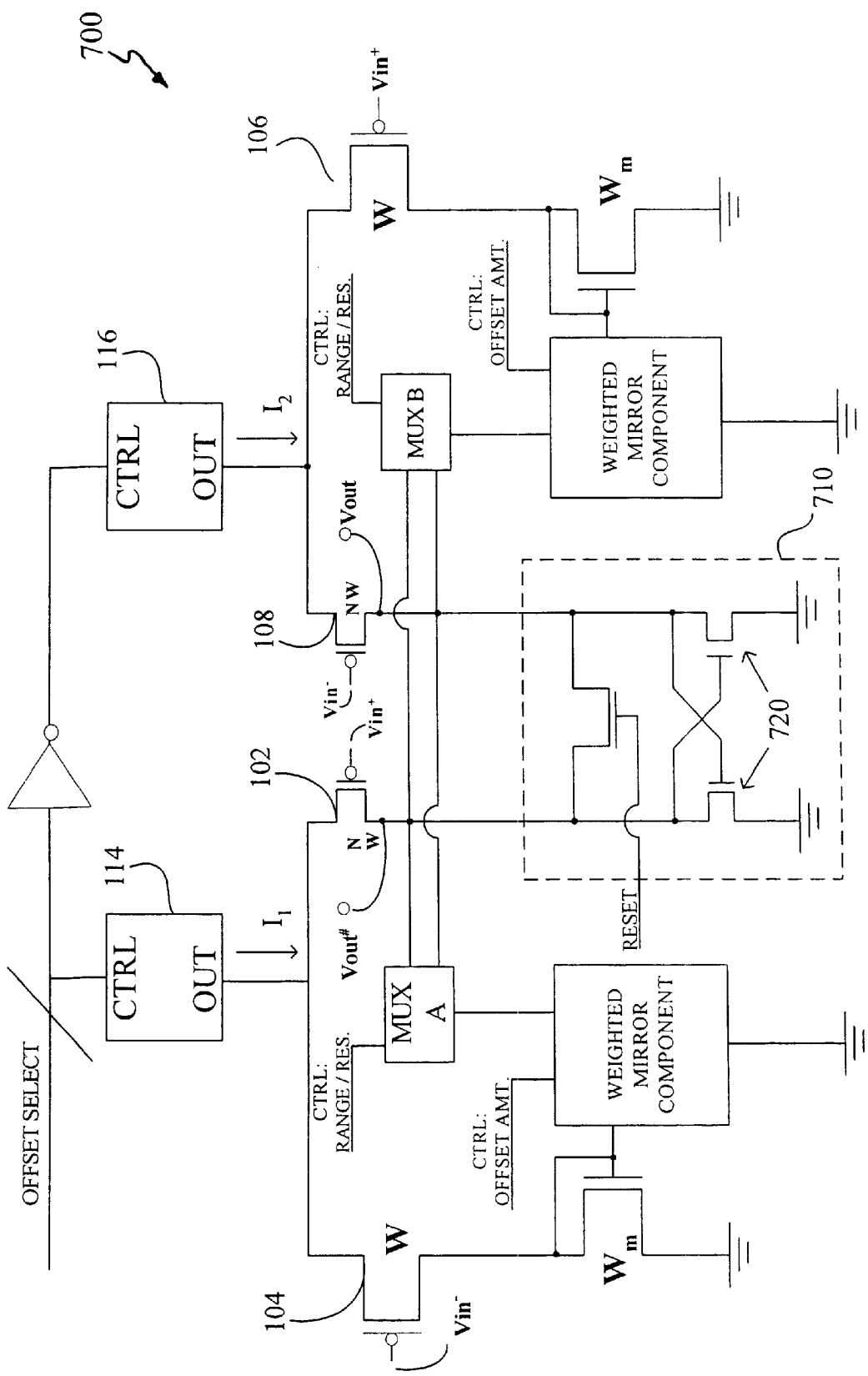
FIG. 7 is a schematic diagram of an embodiment of a variable offset comparator circuit in accordance with the invention.

FIG. 7 shows an embodiment of a digitally controllable variable offset comparator circuit 700 in accordance with the invention. The comparator circuit 700 includes an amplifier circuit substantially as shown in FIG. 1, including the first and second differential pairs which are defined by transistors 102, 104 and 106, 108, respectively. The variable current generators 114 and 116 are also coupled to control the tail currents $I_{1c}$ and $I_2$ of the respective differential pairs. The current generators 114, 116 are controlled by a digital value that is received on multiple, offset select lines as shown. In this embodiment, each digital value, of the offset corresponds to two oppositely varying tail currents $I_1$ and $I_2$ that are equidistant from a nominal tail current. This configuration is similar to the example given above in connection with FIG. 1 which helped explain the availability of opposite polarity offset using the amplifier circuit.

A single ended output voltage for this comparator circuit 700 may be available as either $V_{out}^{\#}$ or $V_{out}$. To drive these output signals into one of two possible stable states, a regenerative load circuit 710 is provided as shown. After being reset by an input signal (RESET), this regenerative latch circuit 710 will quickly amplify any difference between $V_{out}^{\#}$ and $V_{out}$, where such amplification occurs at a relatively high gain due to the cross-coupled n-channel pair 720, thereby ensuring that the output signals $V_{out}^{\#}$ and $V_{out}$ only assume one of two possible stable states. Thus, if $V_{in}^{+}$ is greater than $V_{in}^{-}$ by at least the amount of offset that has been set (for example, set by adjusting $I_1$ and $I_2$ as previously described), then the regenerative latch circuit 710 forcefully drives $V_{out}^{\#}$ to a high voltage level. Other types of regenerative latch circuits may be used to provide the digital type output signal typically associated with a sense amplifier for a comparator application. For example, the regenerative latch circuit may include the cross-coupled n-channel pair 720 coupled in parallel with a cross-coupled p-channel pair (not shown).

The variable offset comparator circuit 700 shown in FIG. 7 may behave as a sense amplifier which detects small differences between two analog signals $V_{in}^{+}$ and $V_{in}^{-}$. In this application, a pair of differential signals are sensed, where the first differential signal is applied to the first differential pair 102, 104, while an inverted version of the differential signal is applied to the second differential pair 108, 106. This signal definition assumes that $V_{in}^{+}$ is received at the gate of NW-sized transistor 102, as well as the gate of W-sized transistor 106. Similarly, $V_{in}^{-}$ is received at the gate of W-sized transistor 104 and the gate of NW-sized transistor 108.

Figure 8:
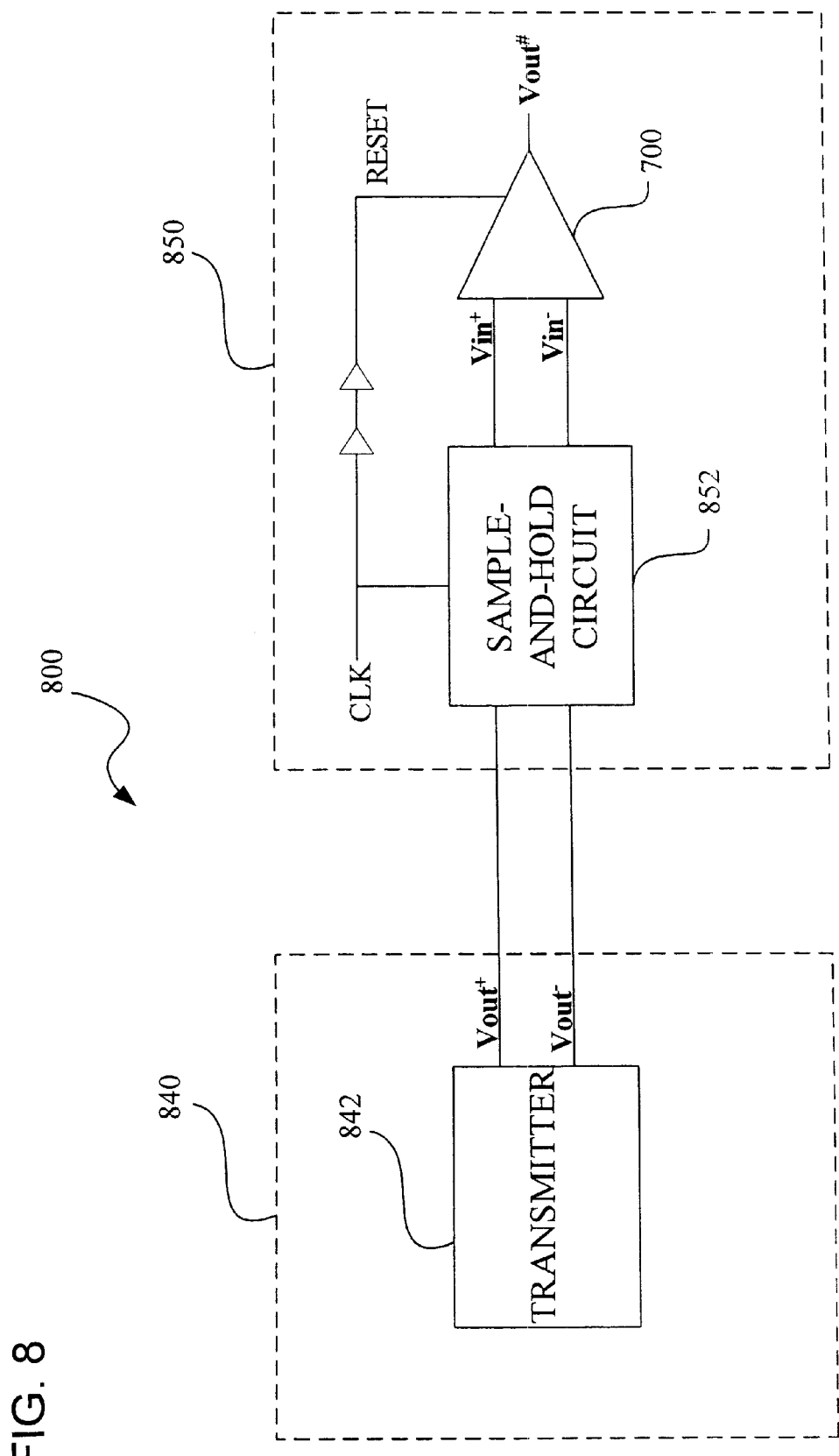
FIG. 8 is a block diagram of a communications system applying the comparator circuit of FIG. 7.

FIG. 8 shows a communications system 800 having the 30 comparator circuit 700 of FIG. 7 in a sense amplifier application. The transmission end of the communication system 700 may reside on a separate integrated circuit die or separate circuit board, for example, as depicted by block 840 having a transmitter 842 with differential outputs $V_{out}^{+}$ and $V_{out}^{-}$. These differential output signals are received by a sample-and-hold circuit 852 that may reside, as shown in FIG. 8, on a separate integrated circuit die or separate board as depicted by block 850. A clock signal CLK determines the timing of when the differential signal is sampled, and a delayed clock signal RESET determines the timing of when the sampled-and-held differential signal is compared by comparator circuit 700. If $V_{in}^{+}$ is greater than $V_{in}^{-}$ by at least the amount of offset that has been selected, then the output $V_{out}^{\#}$ of the comparator circuit 700 will be driven to a high voltage level.

A number of embodiments of the invention have been described. Nevertheless, it will be understood that various modifications may be made without departing from the spirit and scope of the invention. For example, the mirror components need not be weighted or adjustable. Also, in some embodiments, the option of having a choice of positive current feedback or negative feedback will not be needed, and so in some embodiments only positive feedback may be an option, while in other embodiments only negative feedback may be an option. Also, the weighting of the two current mirrors need not be the same, and in fact, the circuit may have useful application where only one current mirror is used. Accordingly, other embodiments are within the scope of the following claims.

What is claimed is:

1. An amplifier circuit comprising:

first and second differential transistor pairs, each pair having a first transistor and a second transistor, the first transistors having output nodes for coupling respectively to first and second loads;

first and second current generators coupled to control respective tail currents of the first and second differential pairs; and first current mirror and shunt coupled to shunt a first shunt current comprising a portion of current flowing through one of the first transistors from flowing through a correspondingly coupled load, the first shunt current being mirrored from current flowing through one of the second transistors.

2. The amplifier circuit of claim 1, wherein the first transistors of each pair are larger than the second transistor for the same pair.

3. The amplifier circuit of claim 2, wherein the first and second transistors are respectively matched in size.

4. The amplifier circuit of claim 1, wherein the first and second current generators are variable current generators whose current levels may be set during testing of the circuit.

5. The amplifier circuit of claim 1, wherein the first current mirror is a weighted current mirror.

6. The amplifier circuit of claim 5, wherein the weighting of the current mirror is variable.

7. The amplifier circuit of claim 1, wherein the first current mirror and shunt comprises a multiplexer circuit which either couples the first current mirror and shunt to shunt a portion of current flowing through a first one of the first transistors from flowing through the correspondingly coupled load, or alternatively couples the first current mirror and shunt to shunt a portion of current flowing through a second one of the first transistors from flowing through the correspondingly coupled load.

8. The amplifier circuit of claim 7, wherein the multiplexer circuit may be set either to shunt a portion of current flowing through the first one of the first transistors from flowing through the correspondingly coupled load, or to shunt a portion of current flowing through the second one of the first transistors from flowing through the correspondingly coupled load.

9. The amplifier circuit of claim 1, further comprising a second current mirror and shunt coupled to shunt a second shunt current comprising a portion of current flowing through one of the first transistors from flowing through a correspondingly coupled load, the second shunt current being mirrored from current flowing through one of the second transistors.

10. The amplifier circuit of claim 9, wherein:

the first current mirror and shunt shunts a first shunt current flowing through a first one of the first transistors from flowing through the correspondingly coupled load, the first shunt current being mirrored from current flowing through a first one of the second transistors; and the second current mirror and shunt shunts a second shunt current flowing through a second one of the first transistors from flowing through the correspondingly coupled load, the second shunt current being mirrored from current flowing through a second one of the second transistors.

11. The amplifier circuit of claim 10, wherein the first and second current mirrors and shunts each comprise a multiplexer circuit that determines which of the first and second loads from which the respective current mirror and shunt will shunt current.

12. The amplifier circuit of claim 11, wherein each of the multiplexer circuits may be set to shunt current from either the first load or from the second load.

13. The amplifier circuit of claim 10, wherein the first and second current generators are variable current generators whose current levels may be set during testing of the circuit.

14. The amplifier circuit of claim 1, wherein the first and second current mirrors comprise first and second diode-connected transistors coupled respectively to first and second ones of the second transistors.

15. An amplifier circuit comprising:

first and second differential transistor pairs, each pair having a larger transistor and a smaller transistor, the larger and smaller transistors being respectively matched in size, the larger transistors having output nodes for coupling respectively to first and second loads;

first and second current generators coupled to control respective tail currents of the first and second differential pairs;

first current mirror and shunt coupled to shunt a first shunt current comprising a portion of current flowing through a first one of the larger transistors from flowing through the first load, the first shunt current being mirrored from current flowing through one of the smaller transistors; and second current mirror and shunt coupled to shunt a second shunt current comprising a portion of current flowing through a second one of the larger transistors from flowing through the second load, the second shunt current being mirrored from current flowing through one of the smaller transistors.

16. The amplifier circuit of claim 15, wherein the first and second current generators are variable current generators whose current levels may be set during testing of the circuit.

17. The amplifier circuit of claim 15, wherein the first and second current mirrors are each weighted current mirrors.

18. The amplifier circuit of claim 17, wherein the weighting of the current mirrors is variable.

19. The amplifier circuit of claim 15, wherein the first and second current mirrors and shunts each comprise a multiplexer circuit that determines which of the first and second loads from which the respective current mirror and shunt will shunt current.

20. The amplifier circuit of claim 19, wherein each of the multiplexer circuits may be set to shunt current from either the first load or from the second load.

21. The amplifier circuit of claim 20, wherein the first and second current generators are variable current generators whose current levels may be set during testing of the circuit.

22. The amplifier circuit of claim 21, wherein the first and second current mirrors are each weighted current mirrors.

23. The amplifier circuit of claim 15, wherein the first and second current mirrors comprise first and second diode-connected transistors coupled respectively to first and second ones of the smaller transistors.

24. A comparator circuit comprising:

(a) a pre-amplifier circuit comprising:

(1) first and second differential transistor pairs, each pair having a first transistor and a second transistor, the first transistors having output nodes for coupling to loads;

(2) first and second current generators coupled to control respective tail currents of the first and second differential pairs;

(3) first current mirror and shunt coupled to shunt a first shunt current comprising a portion of current flowing through a first one of the first transistors from flowing through a correspondingly coupled load, the first shunt current being mirrored from current flowing through one of the second transistors; and (4) second current mirror and shunt coupled to shunt a second shunt current comprising a portion of current flowing through a second one of the first transistors from flowing through a correspondingly coupled load, the second shunt current being mirrored from current flowing through one of the second transistors; and (b) a regenerative latch circuit coupled to the output nodes of the first transistors of the pre-amplifier circuit.

25. The comparator circuit of claim 24, wherein the first differential transistor pair is to receive an input signal at the first and second transistors of that pair, and the second differential transistor pair is to receive an inverted version of the input signal at the first and second transistors of that pair.

26. The comparator circuit of claim 24, wherein the variable current generators have their respective level of tail currents set during testing of the circuit.

27. The comparator circuit of claim 26, wherein the variable current generators are settable so that the tail currents are set to current levels that are equally and oppositely offset from a nominal current level.

28. The comparator circuit of claim 24, wherein the first and second current mirrors comprise first and second diode-connected transistors coupled respectively to first and second ones of the second transistors.

29. A communication system comprising:

(a) a transmitter producing a differential voltage signal;

(b) a receiver comprising:

(1) a sample-and-hold circuit that receives the differential voltage signal and samples and holds values of the differential voltage signal; and (2) a comparator circuit comprising:

(i) a pre-amplifier circuit comprising:

(a) first and second differential transistor pairs, each pair having a first transistor and a second transistor, the first transistors having output nodes for coupling to nodes;

(b) first and second current generators coupled to control respective tail currents of the first and second differential pairs;

c) first current mirror and shunt coupled to shunt a first shunt current comprising a portion of current flowing through a first one of the first transistors from flowing through a correspondingly coupled load, the first shunt current being mirrored from current flowing through one of the second transistors; and (d) second current mirror and shunt couple to shunt a second shunt current comprising a portion of current flowing through a second one of the first transistors from flowing through a correspondingly coupled load, the second shunt current being mirrored from current flowing through one of the second transistors; and (ii) a regenerative latch circuit coupled to the output of the pre-amplifier circuit.

30. The communications system of claim 29, wherein the transmitter and the receiver reside on different circuit boards.

31. The communications system of claim 29, wherein the transmitter and the receiver reside on different integrated circuit die.

32. The communications system of claim 29, wherein the differential transistor pair receives the differential voltage signal at the first and second transistors of that pair, and the second differential transistor pair receives an inverted version of the differential voltage signal at the first and second transistors of that pair.

* * * * *